United States Patent
Boyko et al.

[11] Patent Number: 5,953,623
[45] Date of Patent: Sep. 14, 1999

[54] BALL LIMITING METAL MASK AND TIN ENRICHMENT OF HIGH MELTING POINT SOLDER FOR LOW TEMPERATURE INTERCONNECTION

[75] Inventors: Christina M. Boyko; Anthony P. Ingraham, both of Endicott; Voya R. Markovich, Endwell; David J. Russell, Apalachin, all of N.Y.

[73] Assignee: International Business Machines Corporation, Armonk, N.Y.

[21] Appl. No.: 08/835,690

[22] Filed: Apr. 10, 1997

[51] Int. Cl.⁶ .................................................. H01L 21/44
[52] U.S. Cl. ...................... 438/612; 438/613; 438/106; 438/108
[58] Field of Search ................... 438/612–618, 438/106–109

[56] References Cited

U.S. PATENT DOCUMENTS

| | | | |
|---|---|---|---|
| 2,964,839 | 12/1960 | Marafioti et al. | 428/622 |
| 5,026,624 | 6/1991 | Day et al. | 430/311 |
| 5,027,188 | 6/1991 | Owada et al. | 257/758 |
| 5,060,844 | 10/1991 | Behun et al. | 228/203 |
| 5,075,965 | 12/1991 | Carey et al. | 257/778 |
| 5,264,325 | 11/1993 | Allen et al. | 522/25 |
| 5,278,010 | 1/1994 | Day et al. | 430/18 |
| 5,300,402 | 4/1994 | Card et al. | 430/311 |
| 5,316,788 | 5/1994 | Dibble et al. | 427/98 |
| 5,324,569 | 6/1994 | Nagesh et al. | 428/198 |
| 5,341,564 | 8/1994 | Akhavain et al. | 438/108 |
| 5,376,584 | 12/1994 | Agarwala | 438/614 |
| 5,384,283 | 1/1995 | Gegenwarth et al. | 438/614 |
| 5,473,814 | 12/1995 | White | 438/108 |
| 5,668,059 | 9/1997 | Christie et al. | 438/612 |
| 5,777,391 | 7/1998 | Nakamura et al. | 438/108 |
| 5,838,069 | 11/1998 | Itai et al. | 438/612 |

OTHER PUBLICATIONS

E.J. Armstrong, "Dendrite Connector System with Reinforced Base", IBM Technical Disclosure Bulletin, vol. 23, No. 8, p. 3631, Jan. 1981.

C.H. Crockett et al., "UV Image Reworkable Encapsulent for Fatigue Life Enhancement", IBM Technical Disclosure Bulletin, vol. 37, No. 5, p. 127, May 1994.

Shipley, "Tinposit LT–26" Operating Manual, ©1987, (8) pages.

Shipley, "Tinposit LT–34" Operating Manual, ©1984, (4) pages.

G.J. Gaudenzi et al., "Socketed Package for Surface Mount Applications", IBM Technical Disclosure Bulletin, vol. 36, No. 12, pp. 325–326, Dec. 1993.

*Primary Examiner*—Peter Toby Brown
*Assistant Examiner*—Khanh Duong
*Attorney, Agent, or Firm*—Ratner & Prestia; Ronald A. Kaschak

[57] ABSTRACT

A solder interconnection uses preferably lead-rich balls for making a low temperature chip attachment directly to any of the higher levels of packaging substrate. After a solder ball has been formed using standard processes, a ball limiting metal mask is formed using photoresist. A thin cap layer of preferably pure tin is deposited on a surface of the solder balls using a tin aqueous immersion process.

20 Claims, 5 Drawing Sheets

BALL LIMITING METAL MASK AND TIN ENRICHMENT OF HIGH MELTING POINT SOLDER FOR LOW TEMPERATURE INTERCONNECTION

FIELD OF THE INVENTION

The present invention relates in general to a method and structure for adhering a material to a supporting substrate. In particular, the present invention describes a method and structure for improving the interconnection integrity of ball grid array (BGA) modules, controlled collapse chip connections (C4), and flip chips mounted on printed circuit boards and chip carriers.

BACKGROUND OF THE INVENTION

An electronic circuit contains many individual electronic circuit components, e.g., thousands or even millions of individual resistors, capacitors, inductors, diodes, and transistors. These individual circuit components are interconnected to form circuits, and the circuits are interconnected to form functional units. Microelectronic packages, such as chips, modules, circuit cards, circuit boards, and combinations thereof, are used to protect, house, cool, and interconnect circuit components and circuits.

Within a single integrated circuit (IC), circuit component to circuit component and circuit to circuit interconnection, heat dissipation, and mechanical protection are provided by an IC chip. The chip that is enclosed within its module is referred to as the first level of packaging. The first level package can be a dual in-line pin (dip) or quad flat pack, for example.

There is at least one further level of packaging. The second level of packaging is a circuit card. A circuit card performs at least four functions. First, the circuit card is used if the total required circuit or bit count to perform a desired function exceeds the bit count of the first level package, i.e., the chip. Second, the second level package, i.e., the circuit card, provides a site for components that are not readily integrated into the first level package, i.e., the chip or module. These components include, e.g., capacitors, precision resistors, inductors, electromechanical switches, optical couplers, and the like. Third, the circuit card provides for signal interconnection with other circuit elements. Fourth, the second level package provides for thermal management, i.e., heat dissipation.

The industry has moved away from the use of pins as connectors for electronic packaging due to the high cost of fabrication, the unacceptable percentage of failed connections which require rework, the limitations on input/output (I/O) density, and the electrical limitations of the relatively high resistance connectors. Solder balls are superior to pins in all of the above features as well as being surface mountable, which has obvious implications given the increasingly small dimensions in the forefront technologies today.

Solder mounting is not a new technology. The need remains to improve the solder systems and configurations, however, in electronic structures. The use of solder ball connectors has been applied to the mounting of IC chips using the so-called "flip-chip" or controlled collapse chip connection (C4) technology. Many solder structures have been proposed to mount IC chips, as well as to interconnect other levels of circuitry and associated electronic packaging.

Solder typically comprises an alloy of a more nobel metal such as silver (Ag) or lead (Pb) and a more reactive metal such as indium (In) or tin (Sn). The alloy has a lower melting temperature (LMT) than either of the constituent elements. The combination of the elements of the alloy that has the lowest melting temperature is known as the "eutectic alloy." For example, the eutectic Pb/Sn solder alloy is 37/63 weight percent Pb/Sn and has a melting temperature of about 183° C.

Ball grid array (BGA) modules are a type of surface mount module which have an area array of high melting temperature (HMT) solder ball leads. The basic structure is that of a minute solder portion, generally a ball, connected to a bonding site on one of the parts to be electrically joined. The assembly of the part, bonding pad, and solder is then brought into contact with a solderable pad on a second part and the solder is reflowed to achieve the connection. One of the major drawbacks of this configuration is that the solder balls do not always remain in place before connection, during processing, or upon rework. During rework, not only the solderable pad, but also the solder itself, becomes molten. There is no guarantee, therefore, that the solder will remain associated with the first part during heating in subsequent processing.

To handle a large number of I/O's per chip, various BGA and flip chip bonding methods have been developed. In these flip chip bonding methods, the face of the IC chip is bonded to the card.

Flip chip bonding allows the formation of a pattern of solder bumps on the entire face of the chip. In this way, the use of a flip chip package allows full population area arrays of I/O. In the flip chip process, solder bumps are deposited on solder wettable terminals on the chip and matching footprints of solder wettable terminals are provided on the card. The chip is then turned upside down, hence the name "flip chip," the solder bumps on the chip are aligned with the footprints on the substrate, and the chip-to-card joints are all made simultaneously by the reflow of the solder bumps.

The wettable surface contacts on the card are the "footprint" mirror images of the solder balls on the chip I/O's. The footprints are both electrically conductive and solder wettable. The solder wettable surface contacts forming the footprints are formed by either thick film or thin film technology. Solder flow is restricted by the formation of dams around the contacts. The chip is aligned, for example self-aligned, with the card, and then joined to the card by thermal reflow. The assembly of chip and card is then subject to thermal reflow in order to join the chip to the card.

When the packaging process uses organic carriers (e.g., laminates, Teflon®, and flex), the first level flip chip attach process must be performed at low temperature. Although it would seem that a low temperature flip chip would be desirable, this is not the case because the first level interconnection would reflow during subsequent second level attach (assuming a laminate chip carrier). It is well known that the amount of molten solder in this type of flip chip interconnection can cause reliability problems, such as severe delamination.

Flip chips have a grid array of C4 bumps comprising an HMT solder alloy on metal pads on the front side of the chip. The flip chips are positioned on metalized ceramic or organic substrates with the bumps above corresponding metal pads. The assembly is heated to about 20° C. above the solder melting temperature to melt (reflow) the C4 to form solder joints between the corresponding pads of the chip and substrate.

A representation of the general arrangement of an unassembled package 1 is shown in FIG. 1. This package 1 includes an IC chip 10 and a card 21 to be joined by C4 bonding. Solder balls 30 are present on the I/O leads of the IC chip 10. The solder balls 30 on the IC chip 10 correspond to recessed lands on the circuit card 21.

A cutaway view of the assembled microelectronic circuit package 1 is shown in FIG. 2. FIG. 2 shows an IC chip 10 mounted on a circuit card 21. The IC chip 10 is electrically connected and metallurgically bonded to the circuit card 21 by the solder joints 32. FIG. 2 also shows the internal circuitry of the card 21, for example through holes and vias 23, and signal planes and power planes 25.

FIG. 3 is a cutaway view of an IC chip 10 and card 21 with a reflowed solder ball connector 31. This structure is representative of the prior art. The IC chip 10 has an array of I/O leads 11, i.e., contacts 12 on the internal leads 13. The individual contacts 12 are surrounded by a passivation layer 14. Recessed within the passivation layer 14 are ball limiting metallurgy (BLM) wells with an adhesion layer 15, e.g., a chromium (Cr) adhesion layer 15, a wettable metal layer 16, e.g,. a copper (Cu) layer 16, and a flash layer 17, e.g., a gold (Au) flash layer 17. Extending outwardly from the chip 10 is the solder ball 30. The solder ball 30 has a characteristic spherical shape because it has been reflowed. The circuit card 21 has a eutectic Pb/Sn coated on adhesion pad 51.

High melting temperature solder alloys have been used to connect flip chips onto ceramic substrates. Typically, HMT solder alloys include more of the nobel element. For example, a solder alloy of 97/3 weight percent Pb/Sn has a melting temperature of about 330° C. As a means of supporting a solder hierarchy for the subsequent packaging and providing good mechanical fatigue properties of the solder ball, the C4 solder alloy is nominally 97/3 Pb/Sn. The very high Pb content results in a melting point above 300° C. which makes it an unsuitable solder for wetting to the organic laminates.

This technology was originally developed for ceramic chip carriers. Newer chip carriers are polymeric. In order to allow reflow at temperatures that do not damage these polymeric chip carriers, it is desirable to lower the melting temperature of the C4 solder column. This can be done by applying a thin coating of Sn to the Pb/Sn alloy. The Sn diffuses into the solder column, thereby locally lowering the melting temperature. U.S. Pat. No. 5,075,965 issued to Carey et al., and incorporated herein by reference, discloses a process in which Sn is evaporated through a mask onto the Pb/Sn alloy solder column to form an Sn cap in the shape of a truncated cone. Other methods of applying Sn include evaporated Sn on C4 (known as solder-on-chip or SOC), "tin capping" in which wafers are loaded into the solder evaporation equipment a second time to have a thin film of pure Sn deposited on the top of the C4, and eutectic tin-lead plating (TLP) on the card or chip carrier. These processes are expensive, however, and add to the cost of fabrication.

Standard organic chip carriers cannot withstand temperatures required for high temperature solders. Within the last few years, various methods of joining high melting point solders to an organic product at temperatures of 250° C. or lower have been used. One method includes plating eutectic Pb/Sn solder on the pads of organic carriers, as in the case of C4 chip joining. Another method includes screening eutectic solder paste on the product. Joining is accomplished by reflowing the eutectic solder while it is in contact with the higher temperature solder, thereby forming an alloyed joint between the two solders. Both the pattern plating and screening processes are labor intensive and expensive.

In the C4 process, as distinguished from the earlier flip chip process, the solder wettable terminals on the chip are surrounded by ball limiting metallurgy (BLM), and the matching footprint of solder wettable terminals on the card are surrounded by glass dams or stop-offs, which are referred to as top surface metallurgy (TSM). These structures act to limit the flow of molten solder during reflow.

The BLM on the chip is typically a circular pad of evaporated, thin films of Cr, Cu, and/or Au. The Cr dam formed by this conductive thin film well restrains the flow of the solder along the chip, seals the chip module, and acts as a conductive contact for the solder. In the prior art, the BLM and solder are deposited by evaporation through a mask to form an array of I/O pads on the wafer surface. The term "mask" is used generically. The mask can be a metal mask. Alternatively, as used herein, the "mask" can refer to a sequence of BLM deposition, photoresist application, development of the photoresist, and deposition of solder, followed by simultaneous removal of the photoresist and subetching of the BLM, with the solder column acting as a mask.

Presently, there are several techniques that are being developed or used to join high temperature solder to laminates. Some of these processes deposit pure Sn in close proximity or in contact with the BLM on the chip. When C4 technology chips are subjected to a tin coating process, the edge of the BLM contacts the Sn. Subsequent thermal processing causes the Sn to dissolve the BLM. Reaction of the Sn with the Cu in the BLM during solder reflow causes the formation of an undesirable Cu/Sn intermetallic. Excessive intermetallic formation results in C4-to-chip electrical problems.

Organic circuit boards are typically either rigid boards of epoxy filled with fiberglass and reinforced with wiring layers on each external side, or flexible laminates of patterned copper films and polyimide films. Solder paste includes LMT solder alloy particles, flux to remove any surface oxidation, and a liquid carrier. Solder paste is screen printed onto metal pads on the organic circuit board. Leads, such as gull wing leads of surface mount components, are positioned on the paste on the pads and the assembly is heated to reflow the solder to form solder joints between the leads and pads.

Although the art of semiconductor chip to supporting substrate connections is well developed, there remain some problems inherent in this technology. One particular problem is the high processing cost of reducing the melting temperature of the C4 solder column by applying a thin coating of Sn to the Pb/Sn alloy. Another problem is that the edge of the BLM comes into contact with the Sn. Therefore, a need exists for a method and structure which increase the reliability of the connection between an area array package and a supporting substrate.

SUMMARY OF THE INVENTION

The present invention provides a method and structure for improving the interconnection integrity between an area array package and a supporting substrate by providing a thin layer of Sn on the end of a Pb-rich ball by tin immersion, and using a resist layer above the ball limiting metallurgy (BLM). According to one aspect of the present invention, a ball comprising Pb is deposited on solder wettable input/output (I/O) terminals of an IC chip; a layer of Sn having a thickness of preferably less than 12.7 $\mu$m (0.5 mils) is deposited on the exposed surface of the ball using tin aqueous immersion; the ball on the IC chip is aligned with corresponding solder wettable I/O terminals or footprints on a microelectronic circuit card; and the layer of Sn is reflowed to form a Pb/Sn eutectic alloy (37/63 weight percent Pb/Sn)

at the interface between the layer of Sn and the surface of the Pb-rich ball to bond the chip to the microelectronic circuit card.

According to another aspect of the present invention, a layer of photoresist is deposited over and around the ball and patterned before the tin immersion process. According to still another aspect of the present invention, the tin immersion solution comprises Sn in the range of 10 and 13.5 g/l and has an acidity in the range between 7 and 9 percent. In a further aspect of the present invention, the tin immersion solution comprises immersion tin salts having a thiourea weight percent of about 50, a sodium hypophosphite weight percent of about 11, a stannous chloride weight percent of about 9, and a non-hazardous ingredients weight percent of about 30. According to yet another aspect of the present invention, the tin immersion process is performed for about 10 minutes.

The foregoing and other aspects of the present invention will become apparent from the following detailed description of the invention when considered in conjunction with the accompanying drawings.

DESCRIPTION OF EXEMPLARY EMBODIMENTS AND BEST MODE

The present invention is directed to a process and structure for adhering a material to a supporting substrate. The present invention is used to join semiconductor chips, such as ball grid array (BGA) modules and flip chips, to a substrate, such as a printed circuit board, a microelectronic circuit board, or any organic or ceramic chip carrier or organic circuit board. A thin cap layer of a low melting point metal or alloy, preferably tin (Sn), is applied to the end of a high melting point ball, preferably lead-rich, by an aqueous immersion process. The Sn is reflowed to form a eutectic alloy. Sn and lead (Pb) will be used as the preferred materials in the following description of the embodiments, but any low melting point alloy with a high melting point eutectic system can be used. By using the aqueous immersion process, the fabrication is simplified, thereby resulting in a reduced cost. Moreover, a resist layer is deposited above the ball limiting metallurgy (BLM), surrounding the high melting point ball, to prevent the Sn from contacting the BLM. This resist layer increases the reliability of the interconnection by reducing the likelihood of the formation an Sn/BLM intermetallic.

Figure 1:
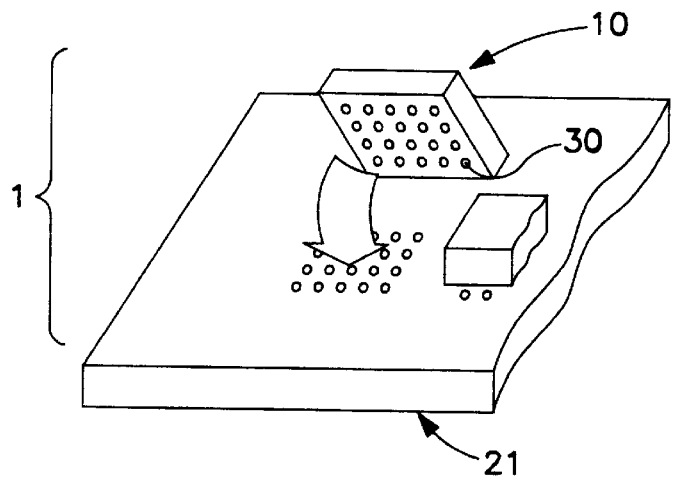
FIG. 1 is a representation of a conventional arrangement of an IC chip, a card, including the solder balls on the I/O's of the IC chip, and corresponding recessed lands on the card.
Figure 2:
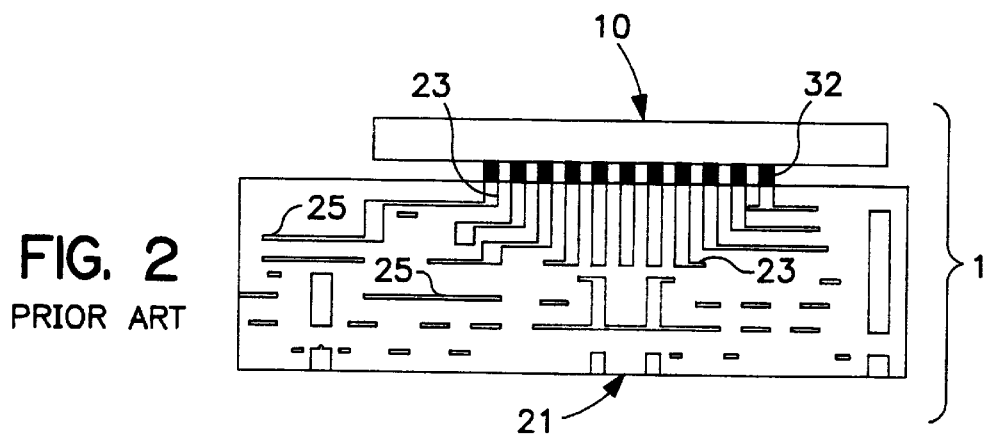
FIG. 2 is a cutaway view of an IC chip mounted on a card, showing the solder joints between the IC chip and the card, and the internal circuitry of the card.
Figure 3:
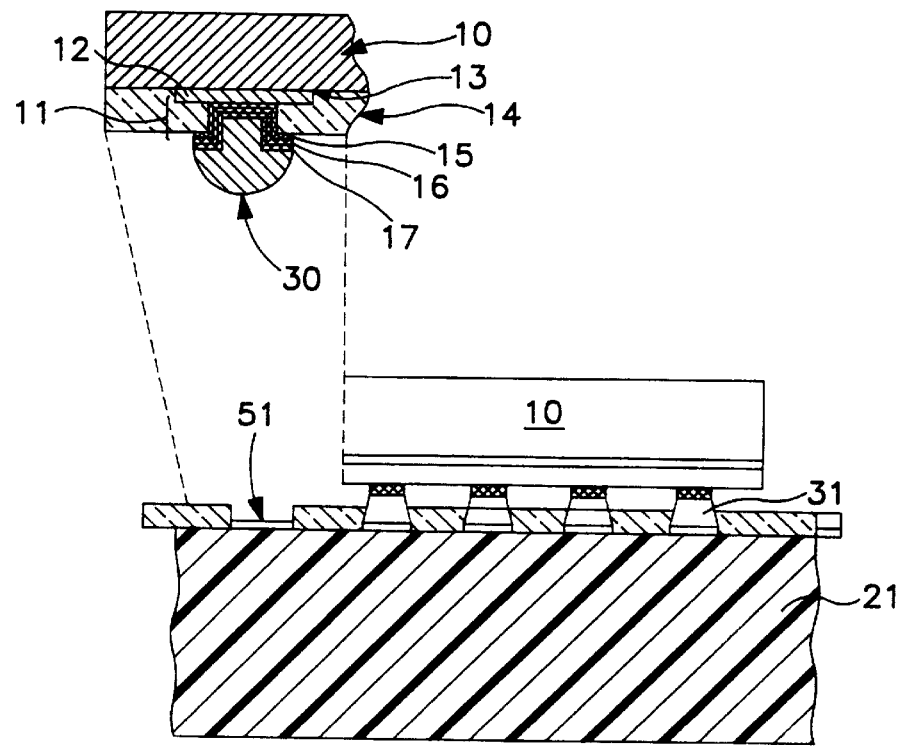
FIG. 3 is a cutaway view of an IC chip and card with a reflowed solder ball connector representative of the prior art.
Figure 4:
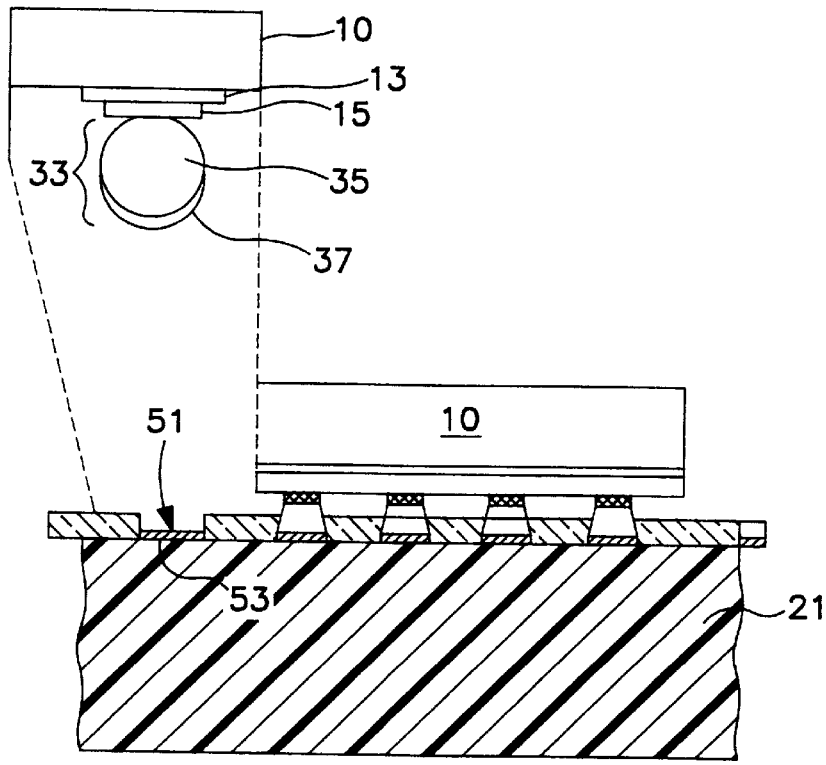
FIG. 4 is a cutaway view of an IC chip and card with a nonreflowed solder assembly in accordance with a first embodiment of the present invention.

The structure of an integrated circuit (IC) chip 10 and a microelectronic circuit card 21 of the first embodiment of the present invention is shown in FIG. 4. FIG. 4 is a cutaway view of an IC chip 10 and card 21 with a nonreflowed solder assembly 33, and a land 53 on which an adhesion or joining pad 51, preferably copper (Cu), is placed. The solder assembly 33 comprises a low melting point cap 37 formed atop a high melting point ball 35. The low melting point cap is preferably Sn, but other low melting point materials such as indium or bismuth can be used.

The high melting point ball 35, preferably Pb-rich, is deposited on solder wettable input/output (I/O) terminals having adhesion layer 15 of an IC chip 10 or a chip carrier or other substrate. The Pb-rich balls are formed by a conventional process and affixed to the IC chip 10 in a conventional manner. A thin cap of Sn 37 is formed on the end of the ball 35 by an aqueous tin immersion process to lower the overall melting point of the ball 35. The thickness of the cap 37 is preferably less than or equal to 12.7 μm (0.5 mils) and is crystalline.

Tin immersion is a process in which up to about 12.7 μm (0.5 mils) of a more nobel metal on a surface are replaced by Sn crystals, by immersion in a bath containing dissolved tin salts such as tin-chloride or tin-sulfate. In other words, an Sn cap is formed using ion exchange from an aqueous solution containing Sn ions. The entire solder ball surface is covered with pure Sn using this tin immersion process. Tin immersion provides the advantages of being less equipment intensive and having a lower cost than other conventional methods of Sn deposition.

At the completion of the immersion, the components are washed to remove all traces of salts and the components are then dried.

The tin immersion process is preferably performed in a solution of 10 to 13.5 g/l Sn having 7 to 9% acidity but can be performed outside these ranges. The preferred immersion tin solution consists of, for a 1 liter volume: 850 ml deionized water, 50 ml concentrated hydrochloric acid, 150 g LT-26 (Shipley® immersion tin salts, manufactured by Shipley Company Inc., Newton, Mass.). The immersion tin salts comprise (by weight percent) thiourea (50), sodium hypophosphite (11), stannous chloride, as tin (9), and non-hazardous ingredients (30).

The Sn is preferably deposited using the Shipley Tinposit® LT-26 solution. Shipley Tinposit® LT-34 solution also can be used.

The tin immersion process is preferably performed on balls of a first metal such as Pb (having 2 to 20 weight percent Sn mixed in to form an alloy) to coat the balls with a uniform layer of a second metal such as Sn.

Thus, a relatively Pb-rich core or ball 35 and a relatively Sn-rich cap 37 are formed. The IC chip 10 has an array of contacts/internal leads 13. An adhesion layer of I/O terminals 15 is used to bond the solder assembly 33 to the IC chip 10. Extending outwardly from the IC chip 10 is the solder assembly 33. The solder assembly 33 has not yet been reflowed, melted, or remelted.

A matching footprint of solder wettable I/O terminals or adhesion pads 51 is provided on a microelectronic circuit card 21. The solder wettable I/O terminals or adhesion pads 51 are substantially free of deposited solder alloy, and are preferably a Cu surface 51, or optionally a surface of Cu and an oxidation inhibitor. The Cu pads 51 on the lands 53 of the circuit card 21 correspond to the solder assemblies 33 on the IC chip 10. Each pad 51 preferably has a dendritic structure on its ball contacting surface. Dendrites are microscopic tree-like structures, typically palladium, grown on pads.

Figure 5:
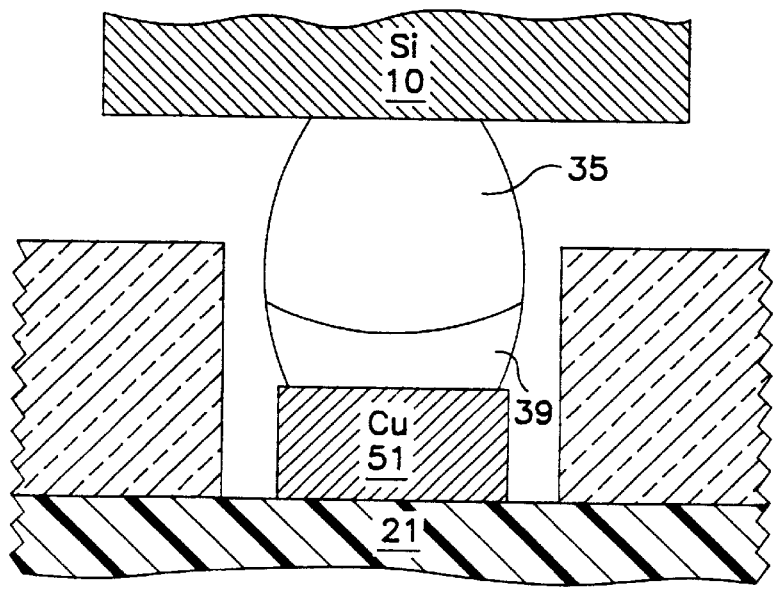
FIG. 5 is a schematic representation of the IC chip, solder assembly, and card land of FIG. 4 after melting and connecting (reflowing)

The solder assemblies 33 on the chip 10 are aligned with the corresponding Cu adhesion pads 51 on the lands 53 on the microelectronic circuit card 21. The Sn, which has a low melting point, is reflowed to bond the Pb-rich ball to the circuit card contact. FIG. 5 is a schematic representation of the IC chip 10, with the solder assembly 33, including the Pb-rich ball 35 and the Sn-rich cap 37, after alignment, melting, and connecting. The solder assembly 33, which has not previously been reflowed, is reflowed to form a Pb/Sn eutectic 39 and bond the IC chip 10 to the microelectronic circuit card 21. The reflow is performed at a temperature greater than the Pb/Sn eutectic temperature (183° C.), preferably about 220° C., to form zones and/or regions of Pb/Sn eutectic at the interface between the Sn layer 37 and the ball 35, thereby connecting the IC chip 10 to the microelectronic circuit card 21. Heating may be carried out by vapor phase, infrared (IR), or convection heating. Bonding occurs by the formation of the Pb/Sn eutectic alloy 39 at the interface between the Pb-rich ball 35 and the Sn-rich cap 37. The Sn-rich cap 37 interacts with the Pb-rich ball 35 of the solder assembly 33 to form the Pb/Sn eutectic 39.

Initial joining is done at a low enough temperature so that the Pb-rich balls do not melt. Thus, the surface of the carrier has electrical features that are directly related to the low melting point metal on the solder ball of the chip to form the eutectic, thereby attaching the chip to the carrier.

The reflow of the Sn on the surface of the dendrite elements results in Sn forming around the base of the dendrite at the interface, thereby reinforcing the dendrite and interface connection.

The Pb/Sn eutectic 39 is preferably 37/63 weight percent Pb/Sn, and its formation is favored by the large amount of Sn in proximity to the Pb, that is, by Sn in the Sn-rich cap 37 in proximity to the Pb in the Pb-rich ball 35. The Sn-rich cap 37 serves as the Sn supply for eutectic formation, thereby obviating the need for a Pb/Sn electroplate on the pads 51. In a preferred embodiment, an anti-oxidant or corrosion inhibitor may be applied to the pads 51.

The Sn from the tin enrichment process potentially contacts the ball limiting metallurgy (BLM) of the chip or wafer. To avoid this problem, the present invention provides a photoresist material to prevent the BLM from contacting the Sn. This prevents degradation of the BLM.

According to the present invention, the BLM, which is typically a fence of metalization layer(s) around the solder ball, is prevented from contacting the Sn by applying a resist layer atop the BLM. Thus, the present invention prevents an Sn/BLM contact. In other words, the present invention uses a resist coated on the surface of a wafer or chip to form a protective coating on and adjacent to the BLM structure of the chip carrier, and surrounding the solder balls themselves. This protective coating prevents or retards the subsequently deposited Sn from reacting with the BLM metal.

Figure 6A:
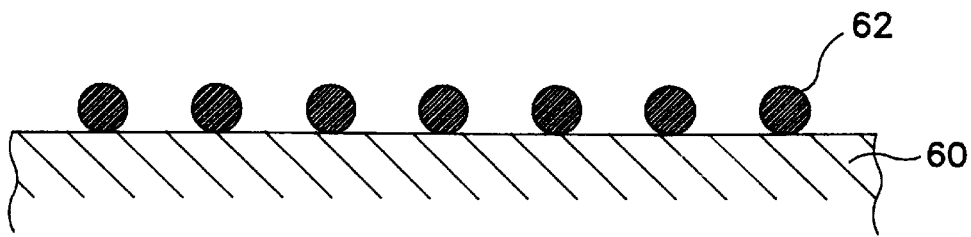
FIGS. 6(a)–6(e) are cross sections of different steps in an exemplary BLM masking process in accordance with the present invention.

An exemplary photoresist deposition process in accordance with the present invention is described with reference to FIGS. 6(a)–6(e). The BLM is not shown but is present around and underneath the solder bumps 62. FIG. 6(a) shows a substrate 60 (e.g., a wafer or a chip, similar to IC chip 10 in FIG. 4) with solder bumps or balls 62 attached.

Figure 6B:
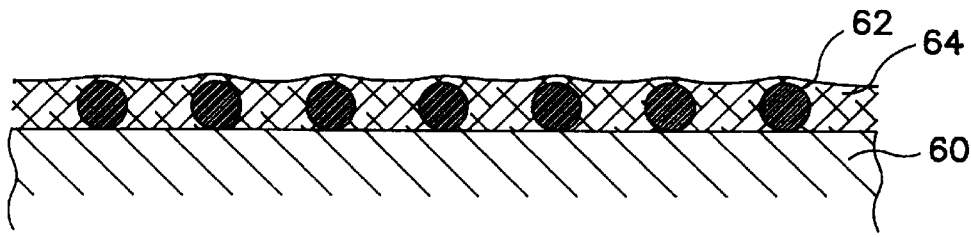

A liquid resist material 64 solvent is coated by using a conventional coating method such as, for example, spin coating, curtain coating, slot coating, or screen coating, over the solder bumps 62, as shown in FIG. 6(b). The resist 64 contains about 20 to 80 percent, preferably 40 to 60 percent, and more preferably about 50 percent, of a solid photosensitive composition in a suitable solvent.

The photoresist is either permanent or temporary. Exemplary permanent resists include those resists described in U.S. Pat. No. 5,026,624 and No. 5,278,010 both issued to Day et al., U.S. Pat. No. 5,264,325 issued to Allen et al., and U.S. Pat. No. 5,300,402 issued to Card et al., and incorporated herein by reference. An exemplary temporary strippable resist is Riston T168 manufactured by DuPont. A number of similar materials are available, however, that are applicable for this procedure. Regardless of the method of resist application, after the resist is applied, the same processing is performed to expose both the top half of the solder bumps and dicing alignment marks on the wafer.

Figure 6C:
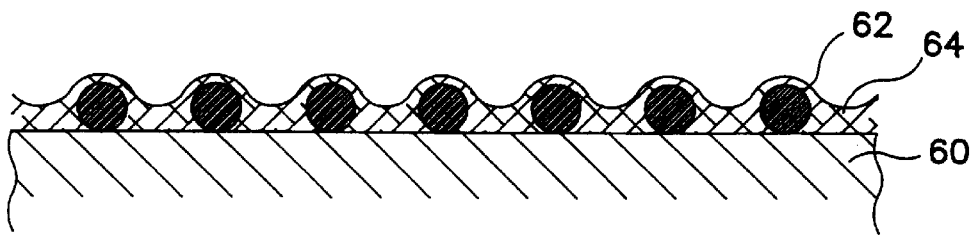
Figure 6D:
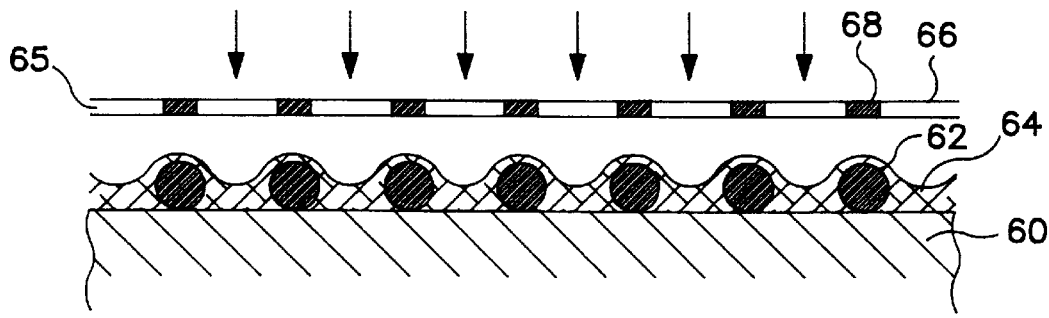
Figure 6E:
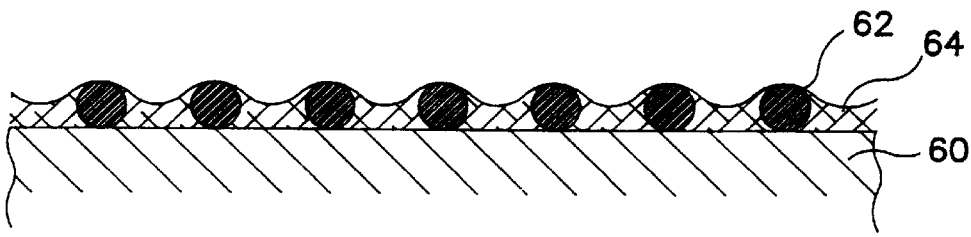

After the resist is deposited, the resist is baked dry. After drying to remove the solvents, the resist 64 shrinks to a height of about half of the solder bump 62 diameter. A thin film of resist 64 remains above the solder bump 62, however, as shown in FIG. 6(c). The coated solder bump array is exposed through a phototool 65 containing clear areas 66 and opaque areas 68 such that the tops of the coated solder bumps 62 are not exposed to actinic radiation and the bulk of the resist material 64 between the solder bumps 62 is exposed, as shown in FIG. 6(d). In a negative acting resist, the exposed portion crosslinks to render it insoluble in a developer solution. The wafer or chip is developed to remove the unexposed portions of the resist 64, thus exposing the tops of the solder bumps 62, as shown in FIG. 6(e). This is followed by the steps of rinsing, drying, and final curing. At this point, depending on the resist used, the resist may need further treatment, such as exposure to more actinic radiation or high temperature baking to further polymerize the resist to enable it to withstand the tin enrichment process. If a temporary resist is used, the resist is removed or stripped before dicing.

By applying a resist mask in the vicinity of the BLM, exposure of the BLM to the deposited Sn is prevented. Moreover, when a permanent resist is used, a partial encapsulation of the C4s for enhanced reliability is provided.

The following exemplary procedure description is for C4 chip technology, but can be used with other technologies.

Integrated circuits in wafer form are fabricated by conventional processing through the steps of wafer testing and C4 reflowing, including the BLM protection process set forth above. At this point in the processing, the wafers are subjected to the Sn enrichment process of the present invention.

Figure 7:
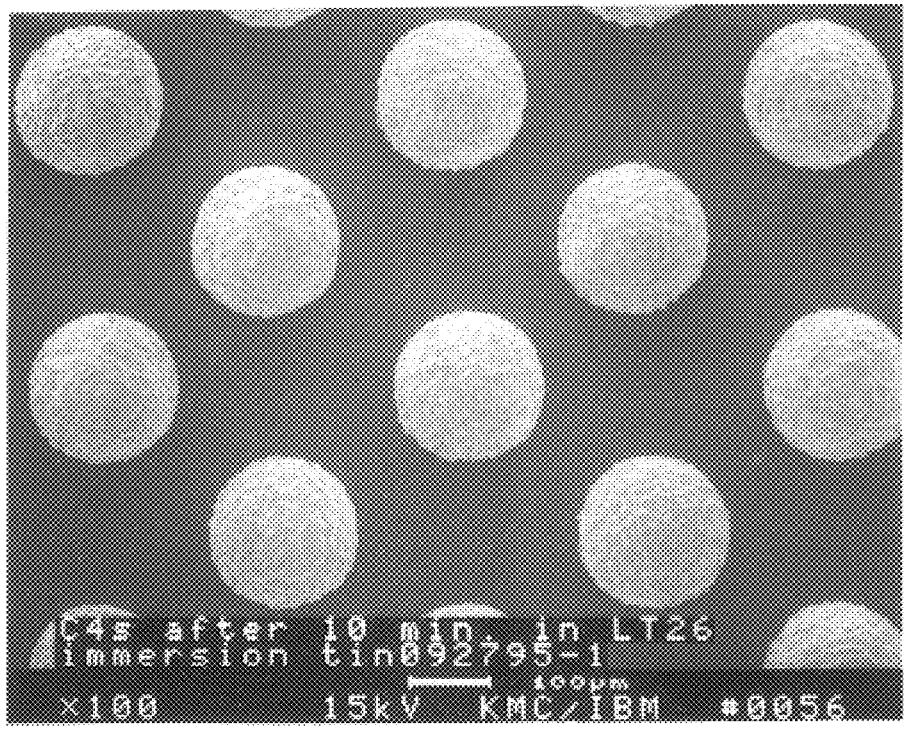
FIG. 7 is a photograph of an exemplary C4 morphology in accordance with the present invention.

Wafers are loaded in fixtures for processing in the tin solution. After being loaded into fixtures, the wafers are placed in an immersion tin solution for a predetermined period of time. This allows an exchange of some of the Pb in the solder with Sn from the solution. An immersion time of ten minutes is preferable in providing the maximum thickness of Sn. Wafers are then rinsed in water and dried. Following the procedure, the C4s have a very crystalline surface morphology which replaces the customary smooth shiny surface. The crystalline structure is the result of the deposited Sn. An example of the C4 morphology is shown in FIG. 7. The Sn deposits on the surface have a very crystalline structure which is typical of an exchange deposit process.

Figure 8:
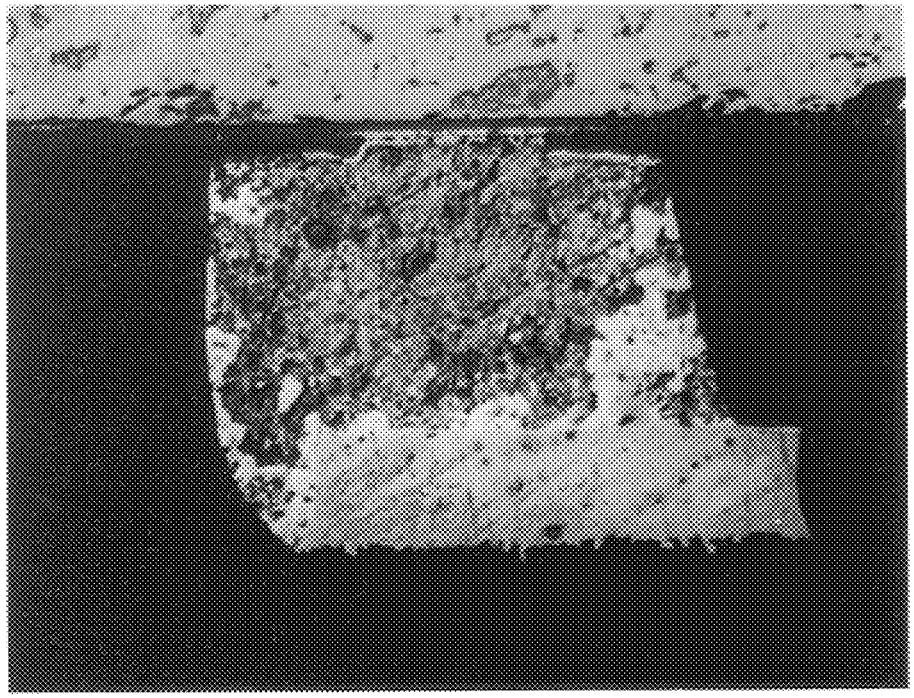
FIG. 8 is a photograph of a cross section of an exemplary C4 in accordance with the present invention.

FIG. 8 is a cross section of a typical C4 joined to a carrier after 10 minutes in an Sn immersion solution. Tin has completely sealed the surface which leads to a self limiting process. Immersion for less than 10 minutes in the Sn solution shows open areas in the Sn coating which indicates that additional time would result in more Sn being deposited. Immersion in the solution beyond 10 minutes does not show additional Sn deposited or a change in the surface morphology. In all cases, joining to organic carriers yielded good results. Inspection of the C4s after connection showed excellent wetting to the copper pads.

Several options are available at this point in the processing. One option is to proceed to dicing, thereby providing chips that are immediately ready for joining to an organic carrier. A second option is to process the wafers through a C4 reflow cycle at 220° C. which causes the pure Sn surface to alloy with the Pb-rich C4 solder. This process option is preferable if visual inspection of the solder pads is desired before dicing. With either of these options, except for the lower reflow temperature, chip joining is performed in the conventional manner, i.e., flux the chip site, place the chip, reflow the solder, and clean.

The above exemplary description is one of many applications for the process technology of the present invention. Tin enrichment can be used with any Pb or Pb/Sn solder system that would benefit from a reduction in the joining temperature while maintaining the high melting temperature core.

A further example of an application is solder ball connection (SBC) technology. Solder balls comprising 90/10 weight percent Pb/Sn can be processed according to the present invention and have a high temperature core and a skin that can be joined directly to organic modules and carriers. In an exemplary embodiment of the present invention, a quantity of solder balls are added to the immersion tin solution and the solution is agitated. After the preferred ten minute dwell or immersion, the solder balls are removed, rinsed with water, and dried. This process results in tin coated high melting temperature solder balls, and eliminates the need for applying eutectic solder to the laminate carrier pads or to the module carrier.

Yet another exemplary application of the present invention is the preparation of solder balls for direct solder ball rework on an SBC product. After removal of a defective solder ball or a missing ball, a preprocessed ball can be placed directly on a pad without the need for dispensing solder paste on the pad. Still another exemplary application of the present invention is the temporary or permanent attachment of a chip to dendrite pads on any carrier requiring a low temperature joining process.

The tin immersion process of the present invention provides the advantage of simplicity. The immersion process is simpler than the conventional pattern plating and solder screening processes. This results in a greatly reduced process cost. Moreover, solder reflow (joining) of a C4 product is a true "controlled collapse chip connection," and not just a solder connection. This true C4 processing provides self alignment during chip joining. Furthermore, solder balls can be prepared for direct low temperature attachment for first pass processing of an SBC product. As described above, the processed balls can be used for ball rework with reduced processing.

According to one exemplary embodiment of the present invention, the concentration of a reactive solder element varies from a low concentration in the core of the bumps to a higher concentration on the surface of the bump. In other words, there is a higher concentration of a reactive solder alloy near the surface than near the center of the ball.

Figure 9:
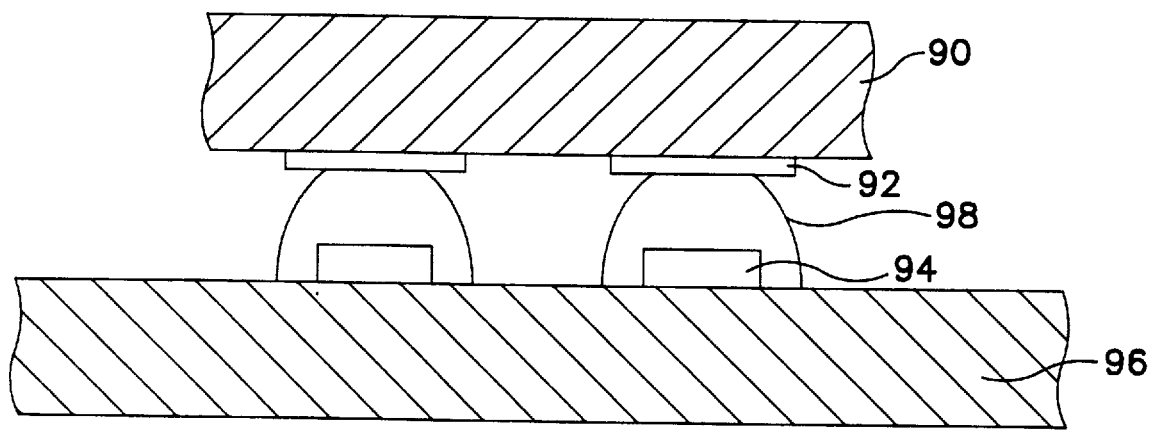
FIG. 9 is a cross section of a further exemplary embodiment of the present invention.

According to another exemplary embodiment of the present invention, the cross section of the bumps near the pad on the chip carrier decreases linearly from the pad, as shown in FIG. 9. In FIG. 9, the chip 90 (e.g., a flip chip) has wettable metal terminals 92 on which the solder bumps, having the above described Sn cap layer, are placed. The solder bumps are reflowed to form a eutectic interconnection 98 with the chip carrier 96 having adhesion pads 94.

According to another exemplary embodiment of the present invention, the minimum cross section of a first solder joint is larger than the cross section of a second joint. The first solder joint corresponds to the Pb-rich ball and the second solder joint corresponds to the low melting point layer, such as Sn.

The above described process and structure can be used for many packaging platforms, including laminates, laminate chip carriers, flex laminate chip carriers, ceramic chip carriers such as eutectic C4, eutectic stud bumps, gold bumps, tin-lead plating or stenciled solder paste on the chip carrier, solder-on-chip (SOC), plastic ball grid array (PBGA), Teflon®, flex, and tape ball grid array (TBGA) packages, as well as other direct chip attach applications on a motherboard. Moreover, the above described process and structure can be used for any eutectic-like system, such as Pb/Au.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A process of joining an integrated circuit (IC) chip to a microelectronic circuit card comprising the steps of:
   depositing a ball comprising a solder on solder wettable input/output (I/O) terminals of said IC chip such that said ball has an exposed surface for connecting to said microelectronic circuit card;
   immersing the exposed surface of said ball in an aqueous immersion solution thereby depositing a layer of a material having a thickness on the exposed surface of said ball;
   providing a matching footprint of solder wettable I/O terminals on said microelectronic circuit card;
   aligning said ball on said IC chip with the corresponding footprint on said microelectronic circuit card; and
   reflowing said layer of said material on said exposed surface to form an eutectic alloy on said ball to bond said IC chip to said microelectronic circuit card.

2. The process of claim 1, wherein the solder comprises lead (Pb) and tin (Sn).

3. The process of claim 2, wherein said ball has an Sn weight percent in the range between about 2 and 20 percent.

4. The process of claim 2, wherein said material is Sn and said eutectic alloy is Pb/Sn.

5. The process of claim 4, wherein the thickness of said layer of Sn is less than 12.7 $\mu$m (0.5 mils).

6. The process of claim 5, wherein the aqueous immersion solution is a tin immersion solution comprising Sn in the range of 10 and 13.5 g/l and having an acidity in the range between 7 and 9 percent.

7. The process of claim 6, wherein said tin immersion solution comprises immersion tin salts having a thiourea weight percent of about 50, a sodium hypophosphite weight percent of about 11, a stannous chloride weight percent of about 9, and a non-hazardous ingredients weight percent of about 30.

8. The process of claim 1, wherein a surface of said layer of said material is crystalline.

9. The process of claim 1, wherein said step of immersing is performed for about 10 minutes.

10. The process of claim 1, wherein said solder wettable I/O terminals on said microelectronic circuit card are copper (Cu).

11. The process of claim 10, wherein said Cu on said solder wettable I/O terminals has a palladium overcoating having a dendritic structure.

12. The process of claim 1, further comprising the steps of, prior to the step of immersing:

coating a photoresist over said ball and surrounding said ball;

drying said photoresist; and patterning said photoresist using a phototool and developing said photoresist to remove only said photoresist that is coated over said ball.

13. The process of claim 12, wherein said photoresist is a temporary resist or a permanent resist.

14. The process of claim 12, wherein said photoresist comprises a solid photosensitive composition in a solvent in the range between 20 and 80 percent.

15. The process of claim 14, wherein said photoresist comprises a solid photosensitive composition in a solvent in the range between 40 and 60 percent.

16. The process of claim 15, wherein said photoresist comprises about 50 percent of a solid photosensitive composition in a solvent.

17. A process of capping a Pb-rich ball with at least one layer of Sn, said process comprising the steps of:

a) forming said Pb-rich ball on a substrate such that said Pb-rich ball has an exposed surface;

b) forming a photoresist barrier surrounding said Pb-rich ball;

c) immersing the exposed surface of said Pb-rich ball in an aqueous immersion solution thereby depositing a capping layer of Sn having a thickness on the exposed surface of said Pb-rich ball; and d) heating said Pb-rich ball and said capping layer of Sn to form a Pb/Sn eutectic alloy.

18. The process of claim 17, wherein the thickness of said layer of Sn is less than 12.7 $\mu$m (0.5 mils).

19. A process of joining a device to a microelectronic circuit card comprising the steps of:

depositing a ball comprising a solder on solder wettable input/output (I/O) terminals of said device such that said ball has an exposed surface, said device comprising at least one of the group consisting of an integrated circuit, a ball grid array, a flex laminate chip carrier, and a laminate chip carrier;

immersing the exposed surface of said ball in an aqueous immersion solution thereby depositing a layer of a material having a thickness on the exposed surface of said ball;

providing a matching footprint of solder wettable I/O terminals on said microelectronic circuit card;

aligning said ball on said device with the corresponding footprint on said microelectronic circuit card; and reflowing said layer of said material to form an eutectic alloy on said ball to bond said device to said microelectronic circuit card.

20. The process of claim 12, wherein said photoresist is a negative photoresist.

* * * * *